United States Patent
Liu et al.

(10) Patent No.: US 12,382,587 B2
(45) Date of Patent: Aug. 5, 2025

(54) METHODS AND SYSTEMS FOR IMPROVING SURFACE MOUNT JOINDER

(71) Applicant: Taiwan Semiconductor Manufacturing Company, Hsinchu (TW)

(72) Inventors: Hsien-Wen Liu, Hsinchu (TW); Shih-Ting Hung, Sanchong (TW); Jyun-Lin Wu, Hsinchu (TW); Yao-Chun Chuang, Hsinchu (TW); Yinlung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 17/851,097

(22) Filed: Jun. 28, 2022

(65) Prior Publication Data
US 2023/0422403 A1 Dec. 28, 2023

(51) Int. Cl.
| | |
|---|---|
| H05K 3/22 | (2006.01) |
| B23K 1/00 | (2006.01) |
| B23K 101/42 | (2006.01) |
| H05K 1/18 | (2006.01) |
| H05K 3/34 | (2006.01) |

(52) U.S. Cl.
CPC .......... *H05K 3/225* (2013.01); *B23K 1/0016* (2013.01); *H05K 1/181* (2013.01); *H05K 3/341* (2013.01); *B23K 2101/42* (2018.08); *H05K 2201/09136* (2013.01)

(58) Field of Classification Search
CPC ........ B23K 1/0016; B23K 1/008; B23K 1/20; B23K 2101/42; H05K 1/0271; H05K 1/111; H05K 1/181; H05K 2201/09136; H05K 3/225; H05K 3/341; H05K 3/3436; Y02P 70/50
See application file for complete search history.

(56) References Cited

U.S. PATENT DOCUMENTS

| | | | | |
|---|---|---|---|---|
| 5,399,505 | A * | 3/1995 | Dasse | G01R 31/2831 438/462 |
| 5,594,273 | A * | 1/1997 | Dasse | G01R 31/2884 257/536 |
| 5,654,588 | A * | 8/1997 | Dasse | G01R 31/2831 257/734 |
| 2003/0045026 | A1 * | 3/2003 | Fogal | H01L 21/76892 438/129 |

(Continued)

*Primary Examiner* — Timothy J Thompson
*Assistant Examiner* — Rhadames Alonzo Miller
(74) *Attorney, Agent, or Firm* — Lippes Mathias LLP

(57) ABSTRACT

Methods for improving joinder between a surface-mount package and a printed circuit board are disclosed. The warpage at a corner of the surface-mount package and at a corresponding corner of a joint area on the printed circuit board are measured to determine the degree of mismatch. A mini-pad is applied to the corner between the surface-mount package and the joint area on the printed circuit board. The thickness of the mini-pad pushes against the surface-mount package and the printed circuit board, reducing the degree of mismatch below a critical dimension of a ball grid array of the surface-mount package. The surface-mount package can then be soldered to the joint area, reducing or preventing the formation of solder bridges and short circuits.

20 Claims, 21 Drawing Sheets

(56) References Cited

U.S. PATENT DOCUMENTS

2013/0228912 A1* 9/2013 Yu .......................... H01L 23/36
                                                                             257/692
2017/0194231 A1* 7/2017 Chuang ............. H01L 23/49838

* cited by examiner

METHODS AND SYSTEMS FOR IMPROVING SURFACE MOUNT JOINDER

BACKGROUND

High-performance computing (HPC) uses various package types. As package sizes increase, warpage of the package itself becomes a factor with respect to ensuring acceptable yield for surface mounted technology (SMT).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a side cross-sectional view of the PCB. FIG. 3B is a plan view showing the surface of the PCB. FIG. 3C is a magnified view of a joint area which is present on the surface of the PCB, to which the package will be attached or joined. FIG. 3D is a magnified view showing conductive pads in various regions of the joint area on the PCB. FIG. 3E is a magnified view of a corner of the joint area on the PCB.

FIG. 6A is a view of a control, showing a flat surface-mount package and a flat PCB prior to attachment. FIG. 6B is a view of the control after the flat surface-mount package and the flat PCB are soldered together. No solder bridges are present. FIG. 6C is a view of a warped surface-mount package soldered to a flat PCB. Solder bridges are present in the corners.

FIG. 8A shows a mini-pad having a rectangular shape. FIG. 8B shows a mini-pad having a triangular shape. FIG. 8C shows a mini-pad having an L-shape. FIG. 8D shows a mini-pad having a circular shape. FIG. 8E shows a mini-pad formed from multiple dots or circles. FIG. 8F shows a mini-pad having a cross shape. FIG. 8G shows a mini-pad having a trapezoidal shape.

DETAILED DESCRIPTION

Figure 1:
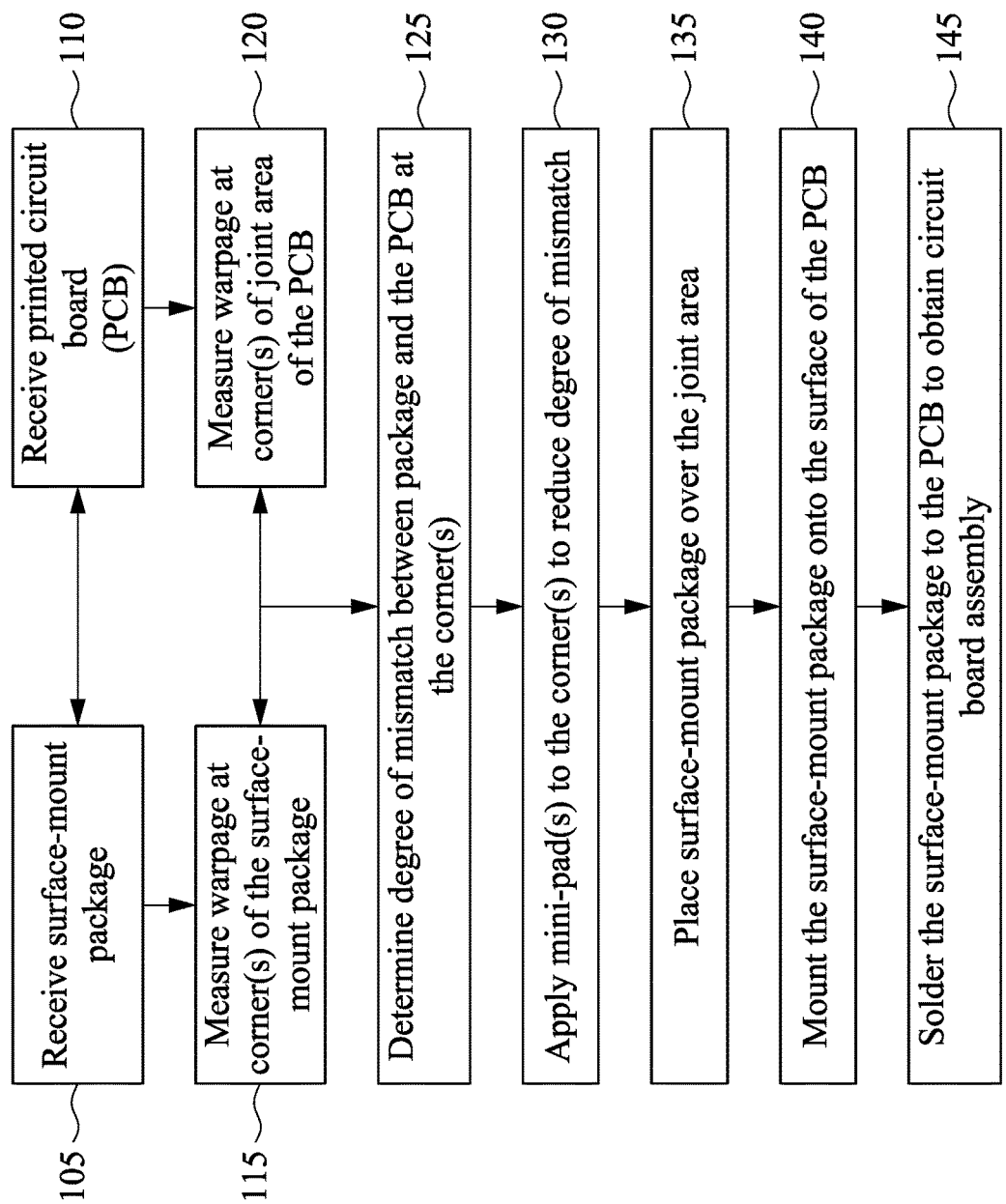
FIG. 1 is a flow chart illustrating a method for joining a surface-mount package and a printed circuit board so as to reduce or prevent solder bridges, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to systems and devices which are made up of multiple components and/or different layers. When the terms "on" or "upon" are used with reference to two different components or layers, they indicate merely that one component/layer is on or upon the other component layer. These terms do not require the two components/layers to directly contact each other, and permit other components/layers to be between them. The term "directly" may be used to indicate two components/layers directly contact each other without any other components/layers in between them.

The present disclosure relates to systems, devices, and methods for compensating for warpage which can occur with a surface-mount package and/or printed circuit board (PCB). This warpage can affect the joint yield when a surface-mount package is attached to a printed circuit board, for example by soldering. Reduced joint yield leads to reduced board-level reliability (BLR) and reduced system-level reliability (SLR). The systems and methods of the present disclosure improve the joint yield.

FIG. 1 is a flow chart illustrating some methods 100 of the present disclosure, in accordance with some embodiments. These methods aid in improving joinder between a surface-mount package and a printed circuit board to which the surface-mount package will be attached. The methods aid in preventing solder bridges which may occur due to mismatch between the surface-mount package and the printed circuit board. FIGS. 2-7 illustrate various steps of the method, and these figures are discussed together.

Referring first to FIG. 1, in step 105, a surface-mount package is received. In step 110, a printed circuit board is received. Next, in step 115, the warpage of the surface-mount package is measured at one or more corners of the package. Similarly, in step 120, the warpage of the printed circuit board is measured at one or more corners of a joint area on a surface of the printed circuit board. These four steps can be performed in any order. The measurements may be performed using known metrology equipment and methods, such as 3-axis strain gauge measurement.

A surface-mount package includes a casing which contains one or more integrated circuits. The package also includes means for connecting the integrated circuit(s) to the external environment, for example a substrate containing electrical contacts such as lands, balls, or pins. For example, the substrate of the package may contain a ball grid array. The package usually protects the integrated circuit(s) from the external environment, for example via a hermetic seal, and may in some embodiments include a heat sink or heat spreader to help dissipate heat.

Figure 2:
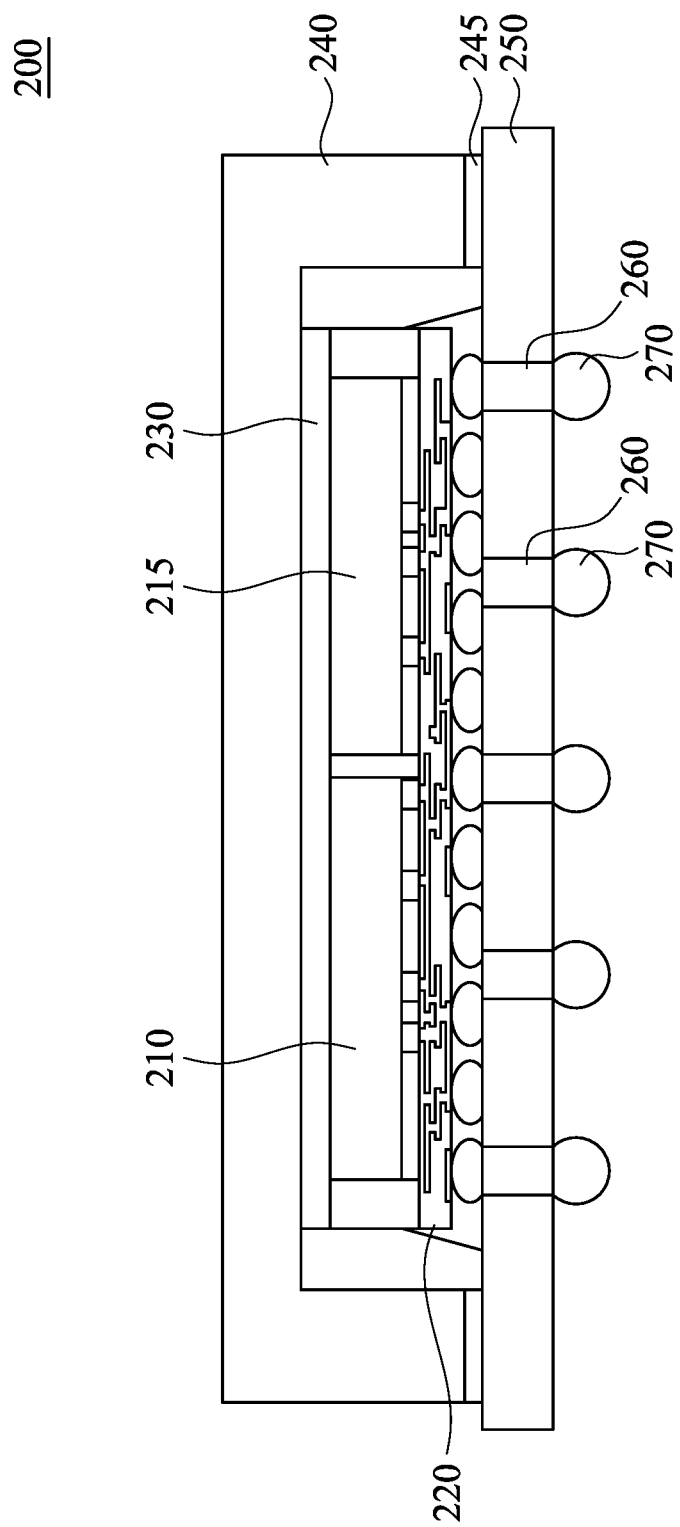
FIG. 2 is a side cross-sectional view of an example of a surface-mount package.

FIG. 2 is a side cross-sectional view of an example of a surface-mount package 200 that may be used in the methods of the present disclosure. The illustrated package includes two integrated circuits 210, 215. Each integrated circuit may be part of a system-on-a-chip (SoC), where many electronic components are combined together on one common substrate. For example, those electronic components may include a central processing unit (CPU), memory, input/output, storage, graphics processing unit, etc. As illustrated here, the two integrated circuits 210, 215 are mounted onto a socket 220, which itself is located upon a substrate 250. A thermal interface material 230 is applied to the top of the integrated circuits. A lid 240 is then placed over the socket and sealed to the substrate 250 using, for example, an adhesive 245. The lid may act as a heat sink for the integrated circuits. The substrate is a printed circuit board whose lower/outer face is covered with a ball grid array (BGA). The BGA is an array of pads 260 with a solder ball 270 attached to each pad. Each pad 260 forms an electrical contact that leads back to the integrated circuit.

Figure 3A:
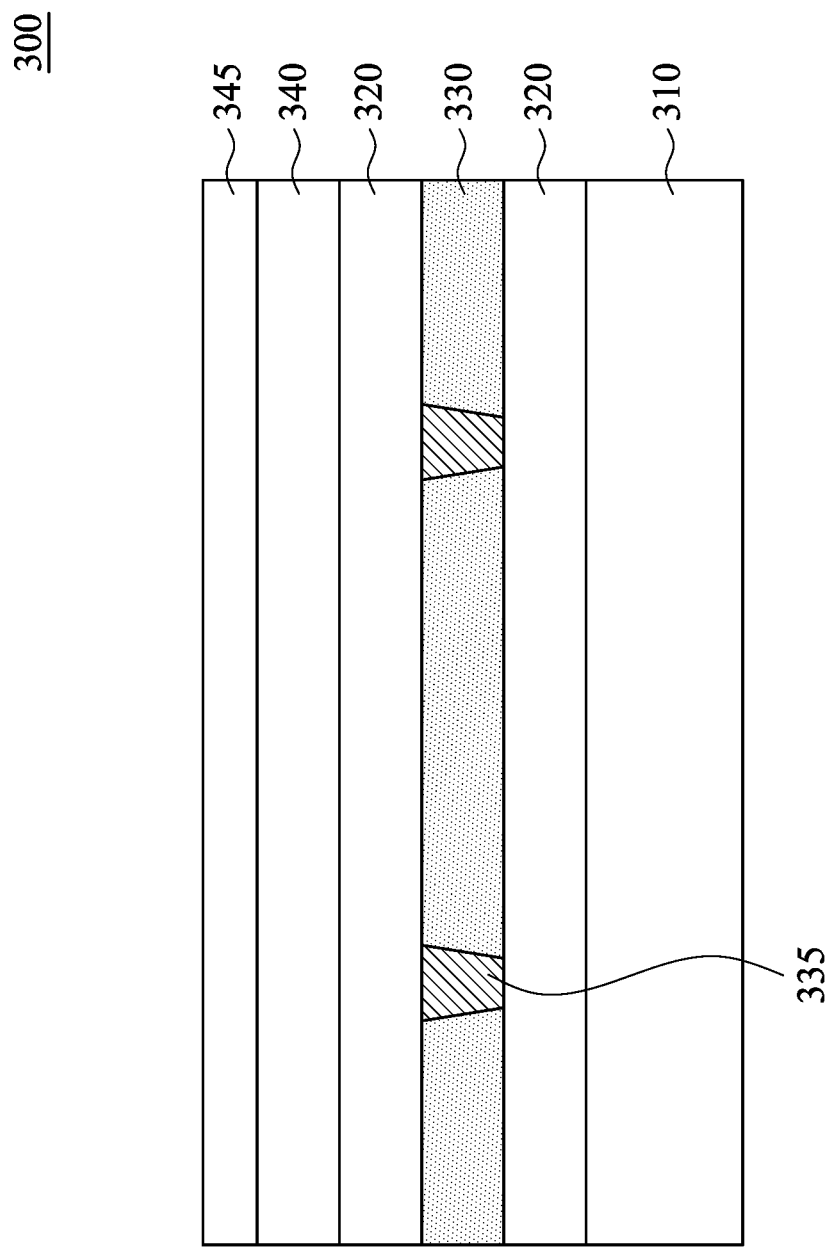
FIGS. 3A-3E are various views of one illustrative construction of a printed circuit board (PCB).
Figure 3B:
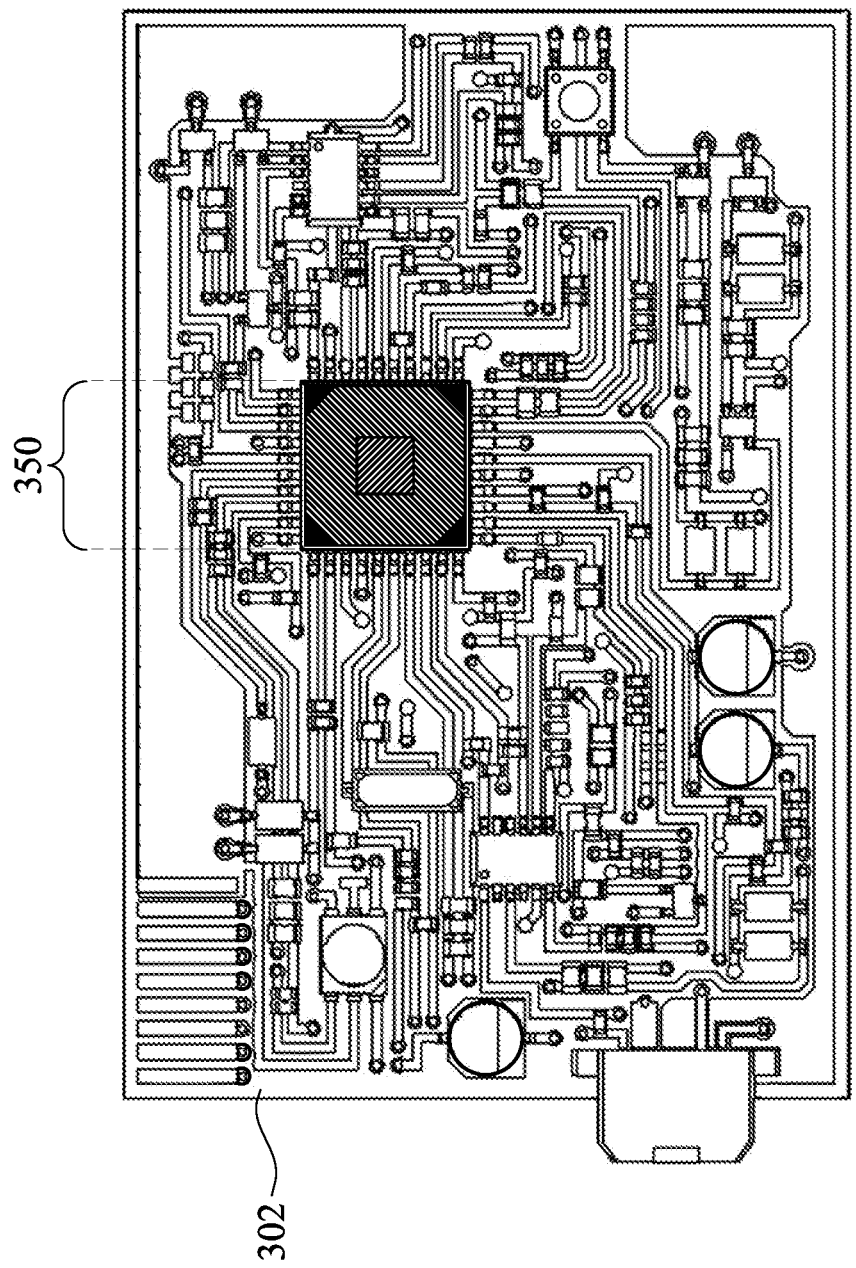
Figure 3C:
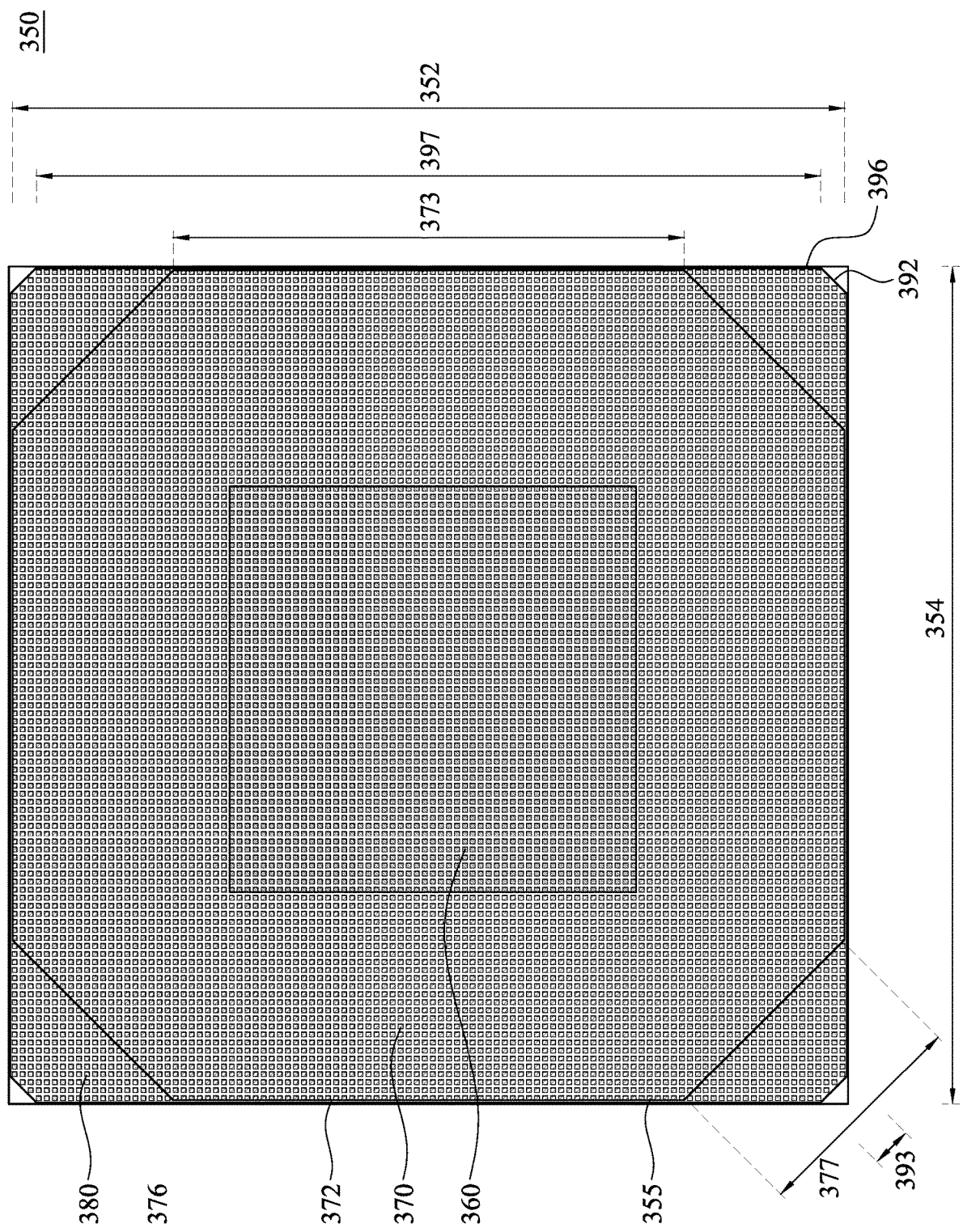
Figure 3D:
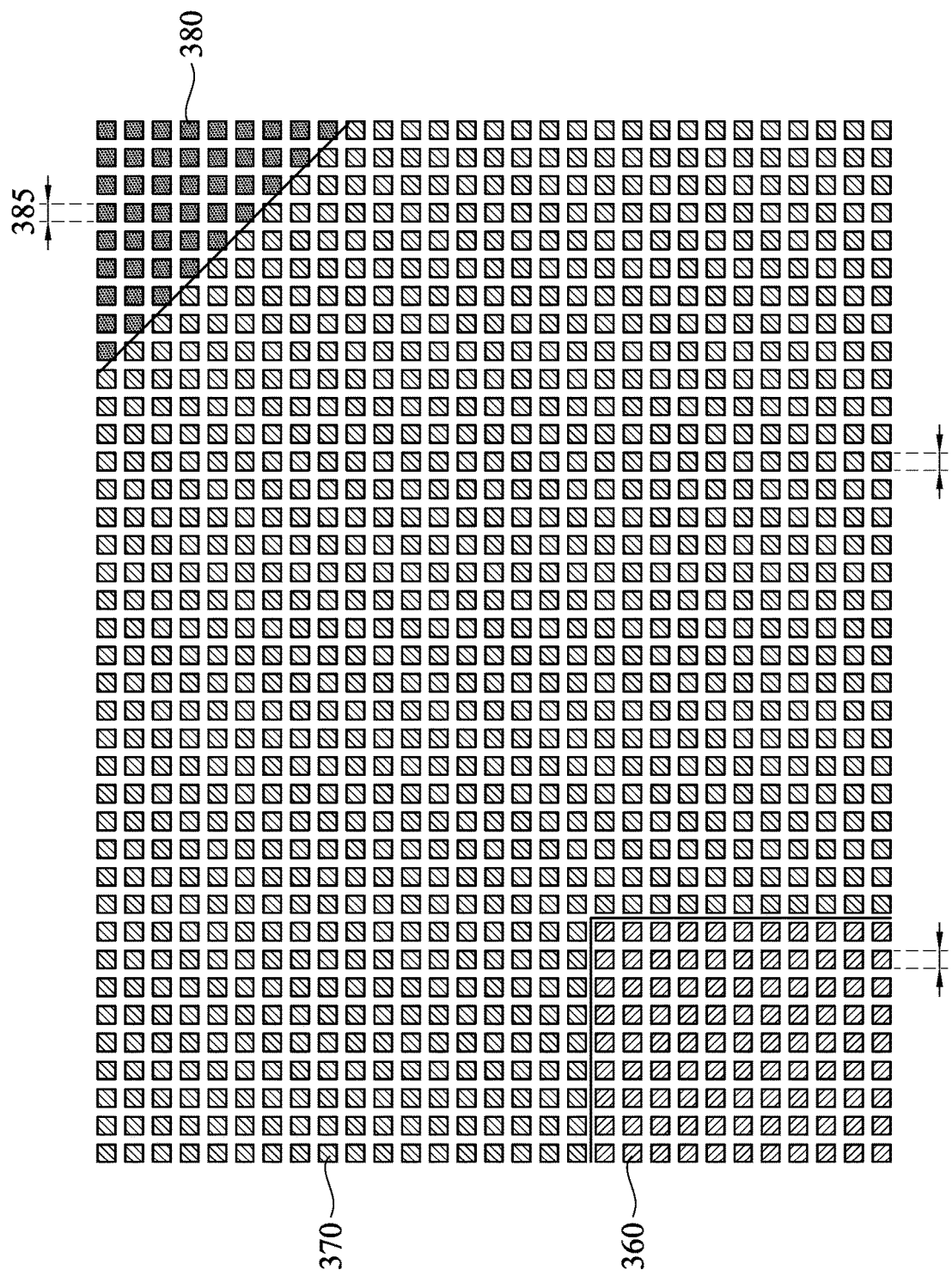
Figure 3E:
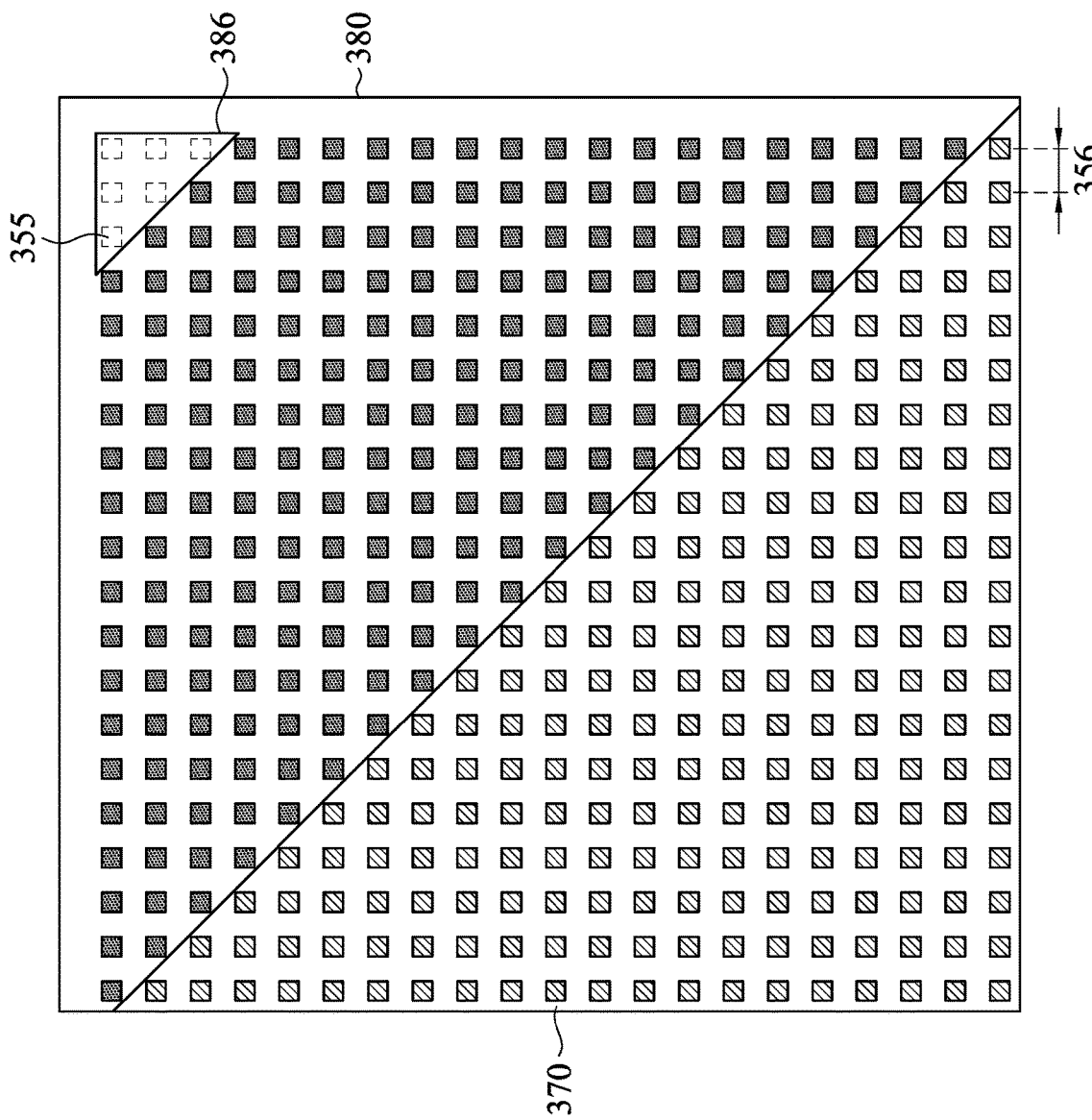

Referring now to FIGS. 3A-3E, a printed circuit board (PCB) is a board that contains conductive layers and insulating layers. Electronic components are attached to the PCB, typically via soldering to create an electrical connection and a mechanical connection. The electronic components are then electrically connected to each other using traces, vias, and other features present in the PCB. FIG. 3A is a side cross-sectional view showing one illustrative construction of a PCB. FIG. 3B is a plan view showing the surface of one illustrative construction of a PCB. FIG. 3C is a magnified view of a joint area which is present on the surface of the illustrative PCB, and to which the surface-mount package 200 is attached. FIG. 3D is a magnified view showing three different regions of the joint area on the PCB. FIG. 3E is a magnified view of a corner of the joint area on the PCB. The package will be joined to the PCB at the joint area.

Referring first to FIG. 3A, the PCB 300 usually includes an electrically insulating core 310 which is commonly made from FR4, a composite of fiberglass with an epoxy resin binder. An electrically conductive layer 320, such as copper, is then applied to one or both sides of the substrate. Electrical traces are etched into the electrically conductive layer. An electrically insulating layer 330 is then applied over the electrically conductive layer 320, such as FR4 or ABF. Multiple electrically conductive and insulating layers can be alternated as desired to obtain the desired electrical patterns. Here, two conductive layers 320 and one insulating layer 330 are shown. Vias 335 may pass through the electrically insulating layer(s) 330 as desired to join separate electrically conductive layers 320 together. A solder resist or solder mask layer 340 is then applied as the outermost layer or layers of the PCB to protect the traces from oxidation and to prevent solder bridges that may otherwise be formed between closely spaced conductive pads (also known as "lands"). The solder resist is also electrically insulating. A silkscreen 345 can then be applied over the solder resist to insert text upon the PCB. This PCB is illustrated as a single-layer PCB in which components are surface mounted on only one side of the core, although the present disclosure also applies to PCBs in which components are surface mounted on both sides of the core.

Referring now to FIG. 3B, the surface of the PCB is indicated with reference numeral 302. The silkscreen indicates where components are to be placed, with the copper layer being exposed in such locations. Conductive traces may also be indicated on the surface of the solder resist. Also present is a joint area 350, where an illustrative surface-mount package will be attached to the PCB. It should be understood that many different components and packages can be surface-mounted upon a single PCB, and the present disclosure is not limited to permitting only one surface-mounted package.

FIG. 3C is a magnified view of the joint area on the PCB 350. As illustrated here, the joint area comprises a plurality of conductive pads 355, which are arranged in rows and columns to form what looks almost like a square array in this view. The contact grid may comprise a central square region 360, an octagonal region 370, and four trapezoidal regions 380. The octagonal region 370 surrounds the central square region 360. The outer perimeter of the octagonal region 370 has eight sides, and can be described as being formed from two different sets 372, 376 of sides, which alternate with each other. The first set 372 of sides includes the sides of the joint area itself, and these sides have a first length 373. The second set 376 of sides is located within the contact grid, and the sides have a second length 377. As illustrated here, the first length 373 is greater than the second length 377, although that is not required. The trapezoidal regions 380 are located on alternating sides of the octagonal region 370, shown here as along the second set 376 of sides. Each region 360, 370, 380 contains conductive pads (also called lands), to which electrical connections are made with the surface-mount package. The joint area itself has a length 352 and a width 354. In some embodiments, the joint area has a size which is greater than 85 millimeters (mm)×85 mm, and in some cases is greater than 110 mm×110 mm. Although in theory the joint area can be of any size, the maximum size of the joint area may also be up to 450 mm×450 mm. The surface-mount package 200 may be of the same size as the joint area (i.e. has the same footprint).

Referring now to FIG. 3D, in particular embodiments, the conductive pads within the central square region 360, the octagonal region 370, and the trapezoidal regions 380 have a different diameter from each other. The conductive pads within the central square region 360 may have a first diameter 365. The conductive pads within the octagonal region 370 may have a second diameter 375. The conductive pads within the trapezoidal regions 380 may have a third diameter 385. In some embodiments, the first diameter is greater than the second diameter, and the second diameter is greater than the third diameter. In more specific embodiments, the first diameter may be from about 600 micrometers to about 700 micrometers. In more specific embodiments, the second diameter may be from about 550 micrometers to about 650 micrometers. In more specific embodiments, the third diameter may be from about 400 micrometers to about 500 micrometers. It is noted that the term "diameter" is also used to refer to the longest side length of a polygon (such as a rectangle) when the conductive pad does not have a circular shape. While the size of the conductive pads may vary between the three regions, the pitch may remain within the same range.

As one non-limiting example, the diameter of the pads in the central square region may be about 0.63 mm, the diameter of the pads in the octagonal region may be about 0.60 mm, and the diameter of the pads in the trapezoidal region may be about 0.45 mm.

In the example illustrated here, the joint area=is a 104× 104 array. The central square region 360 contains a 51×51 array of conductive pads. The trapezoidal regions 380 contain approximately half of a 20×20 array.

FIG. 3E is a magnified view of the corner of the joint area of the PCB. The transition between the octagonal region 370 and a trapezoidal region 380 is illustrated here. The portion of the trapezoidal region that forms one of the corners of the joint area lacks conductive pads. When compared to a rectangular or square joint area, six conductive pads 355 are missing or not present in the corner of the joint area (indicated by dotted lines). Those missing conductive pads form a triangular pattern 386.

The pitch 356 is defined as the distance from the center of one conductive pad to the center of the next adjacent pad in the horizontal and vertical directions (not the diagonal). In various embodiments, the pitch of the conductive pads may range from about 900 micrometers to about 1100 micrometers. The pitch generally will not change between the three regions 360, 370, 380. The conductive pads themselves may have any desired shape, for example a rectangular (including square) or a circular shape.

Thus, referring back to FIG. 3C, the joint area of the present disclosure could be considered to have the shape of a square with missing corners, or could be considered to have the shape of an octagon having four sides 392 of a first length 393 and four sides 396 of a second length 397, the sides alternating with each other. The first length 393 and the second length 397 are different from each other, and in some specific embodiments, the ratio of the first length to the second length is from about 1:15 to about 1:25.

Continuing, during production, the printed circuit board that forms the substrate 250 of the surface-mount package 200 may undergo thermal stresses that result in warping. Such stresses may arise due to, for example, the differences in the coefficient of expansion between the electrically conducting layers and the electrically insulating layers of the printed circuit board in the semiconductor package. This may occur, for example, due to the heterogeneous distribution of copper across the printed circuit board due to the conductor pattern, which can result in uneven or unequal expansion or contraction. The amount of acceptable warpage generally remains the same regardless of the package size (i.e. length and width).

Figure 4:
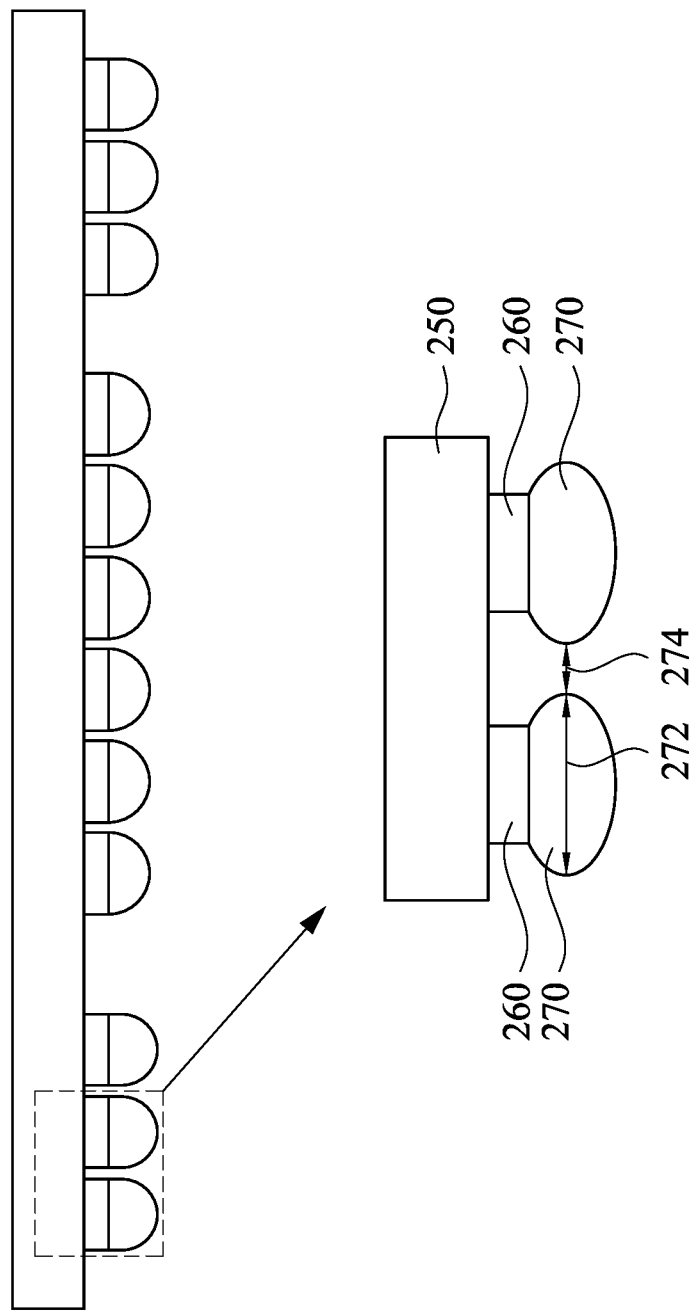
FIG. 4 is a magnified view of a BGA on the bottom of a surface-mount package.

As the package size increases, the acceptable warpage does not change, and may become more difficult to maintain within the acceptable range. For example, FIG. 4 is a magnified view of a BGA on the bottom of a surface-mount package 200, showing the substrate 250 with two adjacent pads 260 and solder balls 270. In this example, each solder ball has a maximum width 272 of about 700 micrometers, and the spacing 274 between the solder balls is about 300 micrometers. The BGA in this example thus has a pitch of 1000 micrometers, and a critical dimension (CD) of about 150 micrometers, or one-half the spacing. This does not change with the package size. Thus, if the package warpage is greater than 150 micrometers, there is an increased risk of forming a solder bridge and/or short circuit, which is undesirable. This discussion also applies to the conductive pads on the PCB of FIGS. 3A-3D.

Referring back to FIG. 1, then, after the measurements of steps 115, 120 are taken, in step 125, the degree of mismatch between the surface-mount package and the contact grid is determined for one or more corners. In some particular embodiments, the degree of mismatch is determined for all four corners. This is done by adding the two warpages together at each corner.

Figure 5:
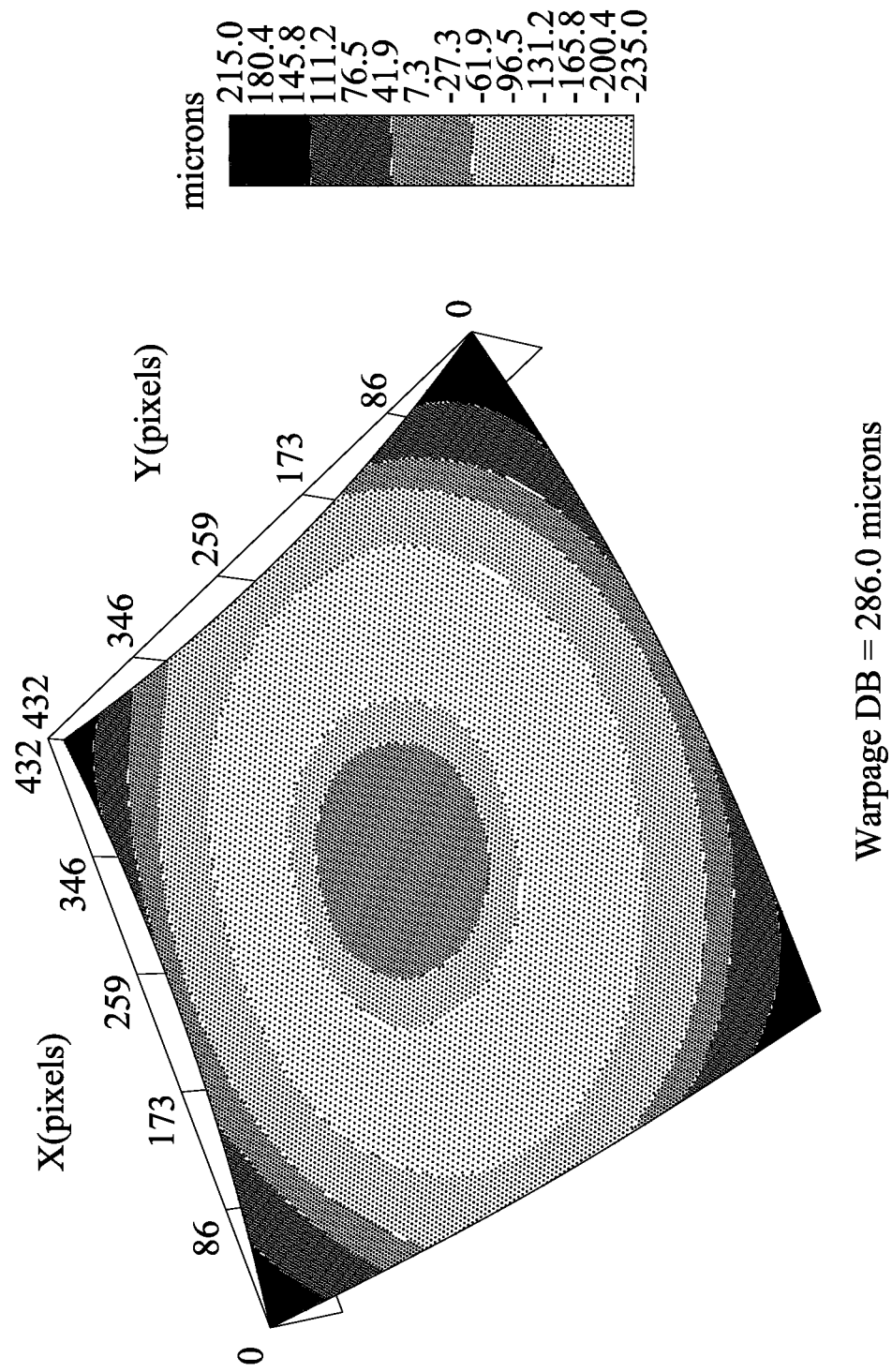
FIG. 5 is an illustrative example of the bottom surface of a substrate of a surface-mount package, showing the degree of warpage of the substrate.

In this regard, FIG. 5 is an illustrative example of the bottom surface of a substrate of a surface-mount package, showing the degree of warpage of the substrate, which is measured in length (micrometers), where zero indicates no warpage (i.e. flat) and a higher value is undesirable. As can be seen here, the degree of warpage is most concentrated at the four corners of the substrate. The warpage is generally measured as the difference from the center of the substrate, which is defined as zero. It is also noted that both the surface-mount package and the PCB can be warped.

Figure 6A:
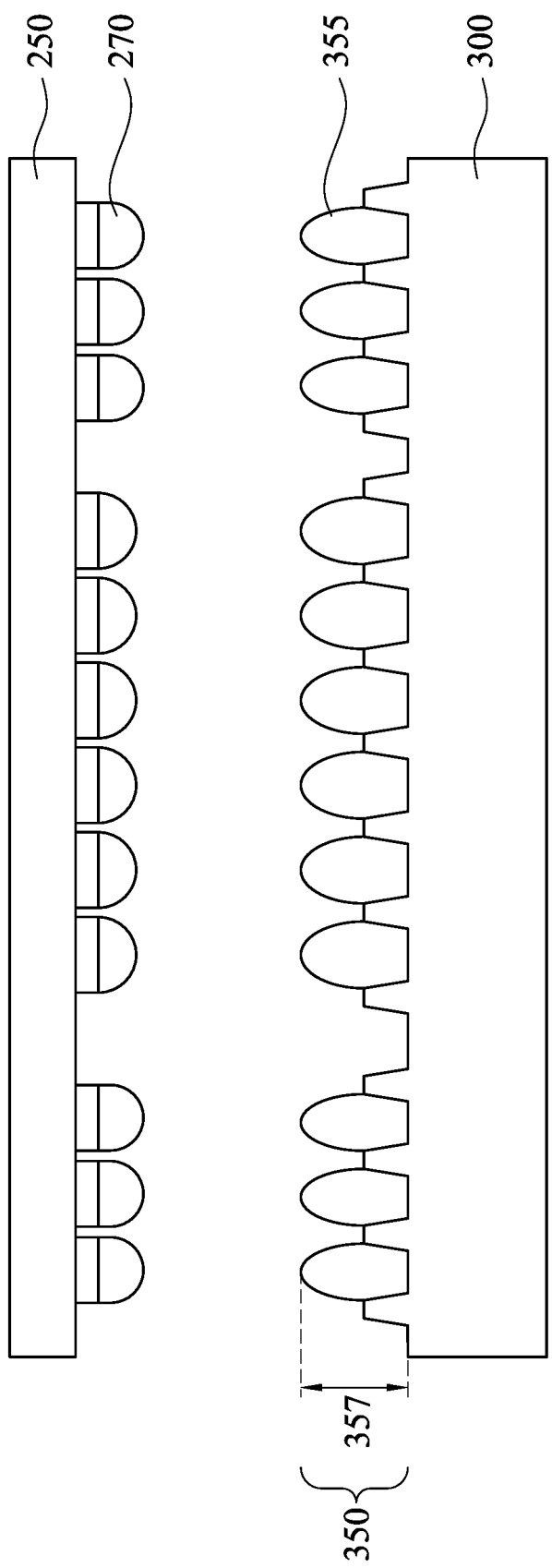
FIGS. 6A-6C are cross-sectional illustrations showing how warpage creates solder bridges.
Figure 6B:
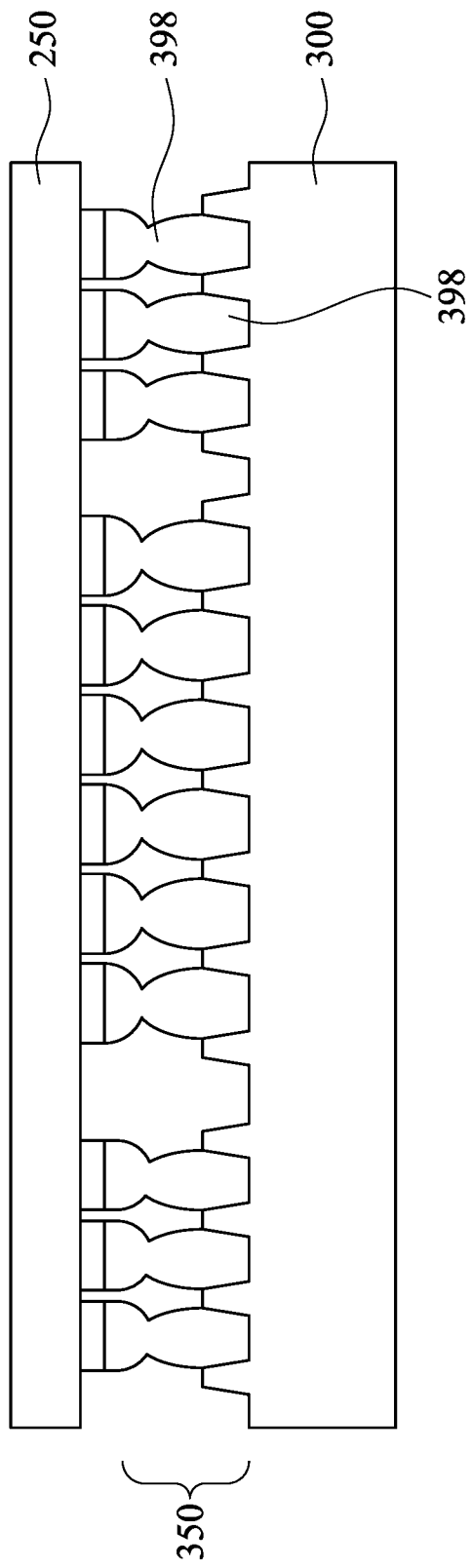
Figure 6C:
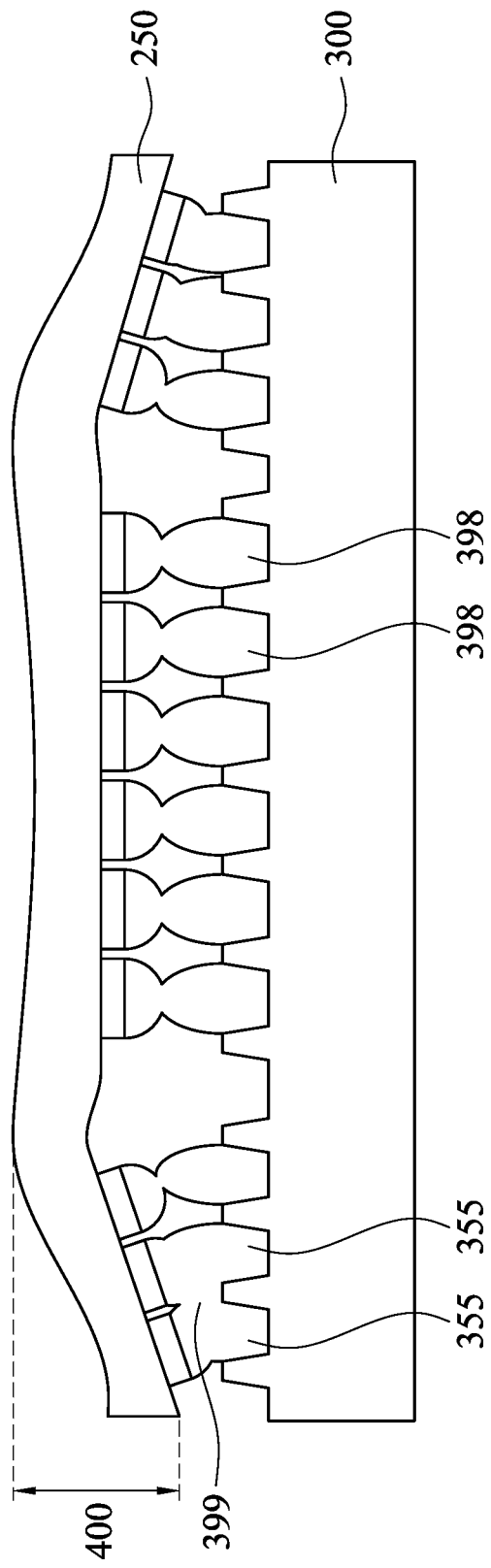

FIGS. 6A-6C are cross-sectional illustrations that show the problem that can occur with warpage. FIG. 6A and FIG. 6B illustrate a situation in which the surface-mount package and the PCB 300 are both flat, or in other words have zero warpage. Here, only the substrate 250 of the package is shown, in the form of a ball grid array having a plurality of solder balls 270. The PCB has a contact grid 350 with a plurality of conductive pads 355. As indicated in FIG. 6A, the conductive pads may have a thickness or height 357 of about 100 micrometers to about 200 micrometers. Moving now to FIG. 6B, when the substrate 250 is joined to the contact grid 350, the individual contacts 398 remain separated from each other, and no solder bridges are formed between them.

Referring now to FIG. 6C, here, the substrate 250 of the surface-mount package is shown with exaggerated warpage at the corners. In the center of the substrate which is relatively flat, the individual contacts 398 are still separated from each other. However, when the warpage at a corner is greater than the critical dimension, then solder bridges 399 may form between two conductive pads 355 at the corner. In this figure, the warpage is indicated with reference numeral 400. In particular embodiments, the warpage may range from about 50 micrometers to about 500 micrometers.

Referring back to FIG. 1, in step 130, a mini-pad is applied to one or more corners of the contact grid. The mini-pad has a thickness sufficient to reduce the degree of mismatch between the surface-mount package and the contact grid below the critical dimension of the ball grid array (BGA) of the surface-mount package.

Next, in optional step 135, the surface-mount package is placed so that the corner(s) of the surface-mount package are over their corresponding corners on the contact grid. In this regard, it should be noted that the surface-mount package generally can only oriented in one way relative to the joint area. Put another way, the surface-mount package cannot be rotated around its axis such that a given corner of the package could be placed over any corner of the joint area.

In step 140, the surface-mount package is then mounted directly onto the surface of the PCB, and in particular onto the joint area of the PCB. The surface tension of the solder balls on the BGA may be sufficient to hold the package to the PCB. Alternatively, adhesive can also be used on the non-contact portions of the package, to secure the package to the PCB.

Then, in step 145, the surface-mount package is soldered to the printed circuit board, in the joint area. The soldering may be performed, for example, by reflow soldering or by wave soldering. It is noted that the mini-pad is left in place on the final assembly of the surface-mount package and the PCB. This assembly can also be referred to as a circuit board assembly.

In reflow soldering, the entire assembly of the package and the PCB are exposed to controlled heating. When the solder paste reaches the eutectic temperature (at which the solder paste undergoes a phase change to a liquid or molten state), the molten alloy exhibits wetting, with properties of cohesion and adhesion. As a result, the molten solder creates permanent solder joints, or in other words forms permanent electrical contacts between the package and the PCB. This can be accomplished in a reflow oven which is made up of several segments. Each segment of the oven has a set and controlled temperature, according to the specific thermal requirements of the assembly. The circuit board assembly is usually placed on a conveyor belt that passes through the segments at a controlled speed. The heat sources in the oven may be infrared, convection, or via vapor phase. The reflow oven temperature profile is based on the characteristics of the particular circuit board assembly, and takes into account factors such as the size and the depth of the ground plane layer within the board, the total number of layers in the PCB, and/or the number and size of the various components. The temperature profile for the circuit board assembly desirably causes reflow of solder onto the adjoining surfaces, but maintains the various electrical components within their temperature tolerance so that they are not damaged by overheating.

Conventional reflow soldering includes four stages: preheat, soak, reflow, and cooling. During preheat, the circuit board assembly is ramped up to a target soak temperature at a safe rate that does not damage the components or cause splattering of the solder. This may also permit volatiles to out-gas. In the soak stage, the flux components of the solder begin oxide reduction. In the reflow stage, the temperature is above the liquidus temperature of the solder, and the solder joints are formed. In the cooling stage, the temperature ramps downward to cool the circuit board assembly and permit the solder joints to solidify with a grain structure that is mechanically sound.

In wave soldering, the circuit board assembly passes over a standing wave of molten solder. The standing wave can be produced by a pump in a pool of solder over which the circuit board assembly is passed. When the circuit board assembly makes contact with the standing wave, the package becomes soldered to the PCB. This may be useful when other components on the PCB are mounted using through-hole techniques.

Figure 7A:
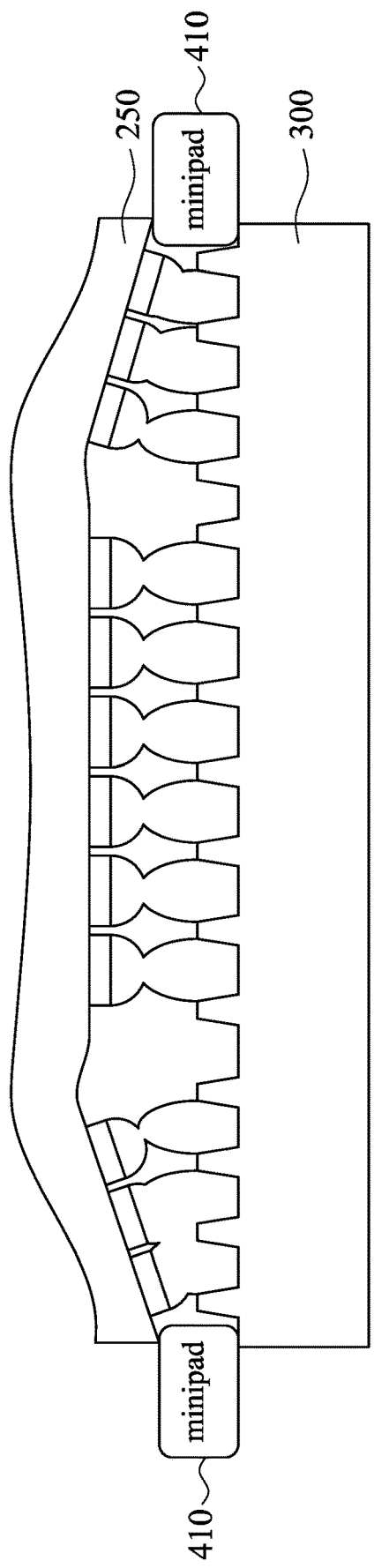
FIG. 7A is a side cross-sectional illustration showing the use of mini-pads to reduce the degree of warpage of a warped surface-mount package which is soldered to a flat PCB. As a result, solder bridges are not present in the corners.

FIG. 7A is a side cross-sectional illustration showing the effect of the methods of the present disclosure, which use one or more mini-pads to reduce the effect of warpage. As seen here, two mini-pads 410 are present between the surface-mount package 200 and the PCB 300. These mini-pads can be considered to push against the warped corners of the package 200. As a result, pre-solder collapse does not occur at the corners. Comparing FIG. 7A to FIG. 6C, no solder bridges are formed at the corners in the illustrative embodiment of FIG. 7A.

Figure 7B:
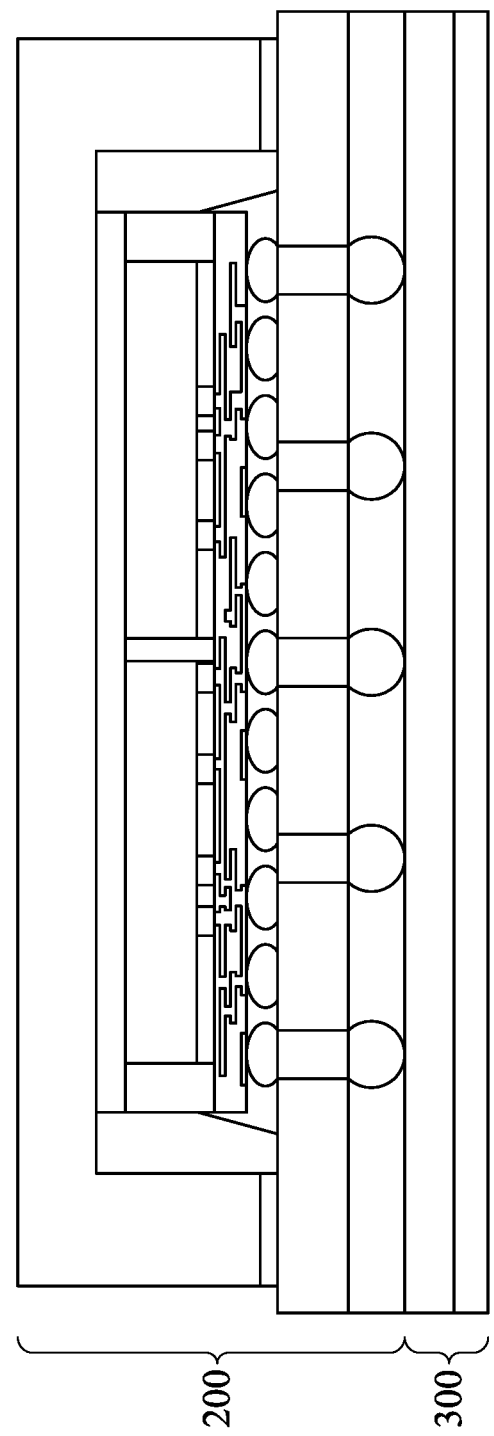
FIG. 7B is a side cross-sectional illustration of the final circuit board assembly.

FIG. 7B is a side cross-sectional illustration showing the final circuit board assembly 405. The package 200 is soldered to the PCB 300. The corners are not visible, and the mini-pads are not visible either.

Figure 8C:
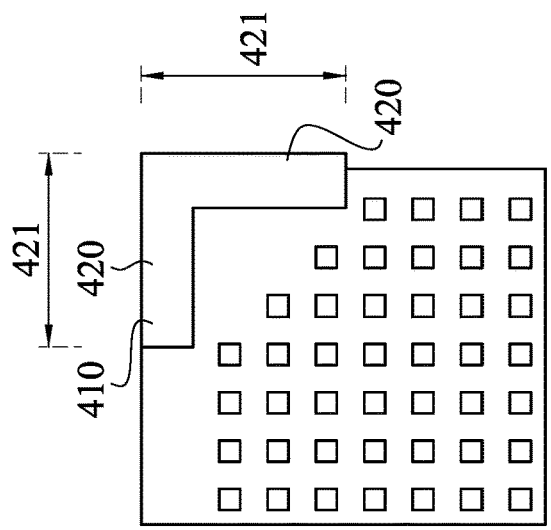
FIGS. 8A-8G are plan view showing different embodiments of the mini-pad.
Figure 8B:
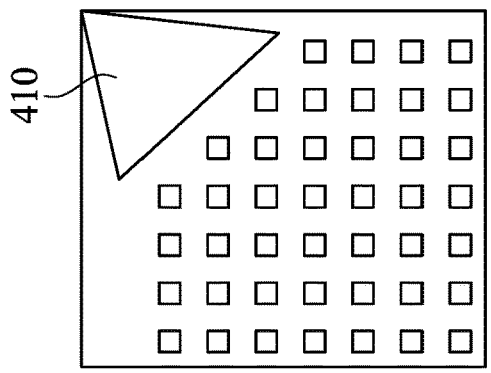
Figure 8A:
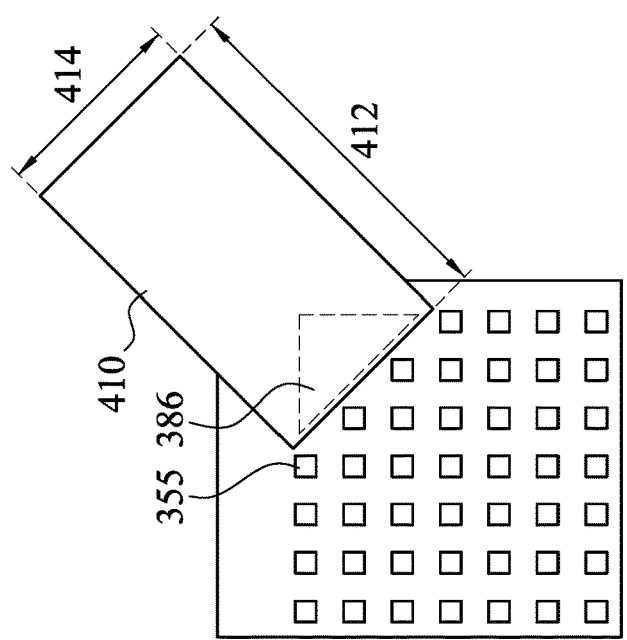

FIG. 8A illustrates one embodiment of the mini-pad 410. Here, the mini-pad has the shape of a rectangle. In embodiments, the mini-pad has a length 412 of about 1 millimeter to about 100 millimeters, a width 414 of about 1 millimeter to about 100 millimeters, and a thickness of about 50 micrometers to about 500 micrometers. Referring to both FIG. 8A and also to FIG. 3D, the mini-pad is applied to the PCB. Each mini-pad 410 is placed in one of the triangular patterns 386 of the joint area that lacks conductive pads (marked in dashed line). As illustrated in FIG. 8A, the width 414 of the mini-pad is placed adjacent to the conductive pads 355, but the length 412 of the mini-pad could also be placed adjacent instead.

In some embodiments, the mini-pad is formed from a plastic that is heat resistant at temperatures above 250° C., or in other words the plastic does not melt at those temperatures. The plastic may be heat resistant up to temperatures of 450° C. Some examples of plastics that have a melting point above 250° C. can include polymers such as ABS (acrylonitrile-butadiene-styrene), acrylates, high density polyethylene (HDPE), nylon, PEEK (polyether ether ketone), polycarbonates, PET (polyethylene terephthalate), polypropylene, PTFE (polytetrafluoroethylene), and thermoplastic elastomers.

The mini-pad may be attached or fixed to the PCB using an adhesive. The adhesive is usually applied along the entire length and width of the mini-pad. Such adhesives should also be heat resistant at temperatures above 250° C. and up to 450° C. Examples of such adhesives may include epoxies, cyanoacrylates, acrylics, or silicones.

Figure 8E:
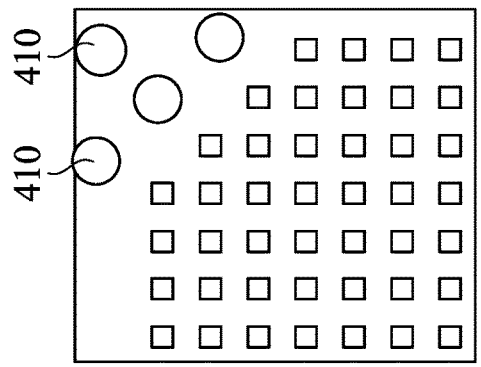
Figure 8G:
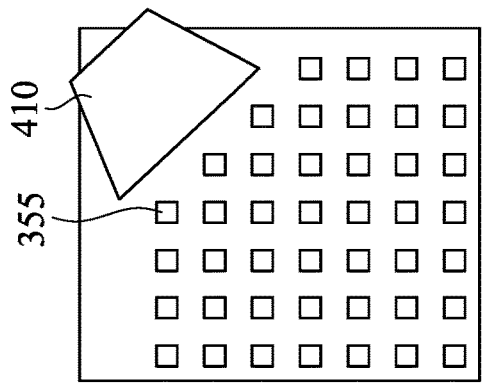
Figure 8D:
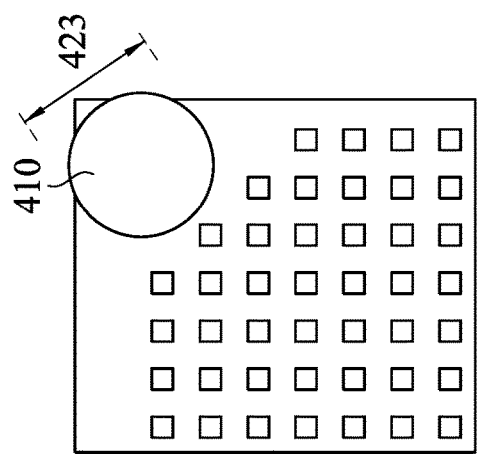

FIG. 8B-8G illustrate other embodiments of the mini-pad. In FIG. 8B, the mini-pad 410 has the shape of a triangle. In FIG. 8C, the mini-pad 410 has an L-shape, in the form of two legs 420 joined at a right angle at one end of each leg. The two legs can be of the same length or have different lengths. The length 421 of each leg may range from about 1 millimeter to about 100 millimeters. In FIG. 8D, the mini-pad 410 has the shape of a circle. In FIG. 8E, a plurality of circles are placed together within the empty triangular pattern in the corner of the joint area. Four such circles are shown here. The circles of FIG. 8E have a smaller diameter 423 than the large circle of FIG. 8D. The diameter 423 of the circle may range from about 1 millimeter to about 100 millimeters. In particularly desirable embodiments, the mini-pad is in the shape of a circle, or in other words has a circular shape.

Figure 8F:
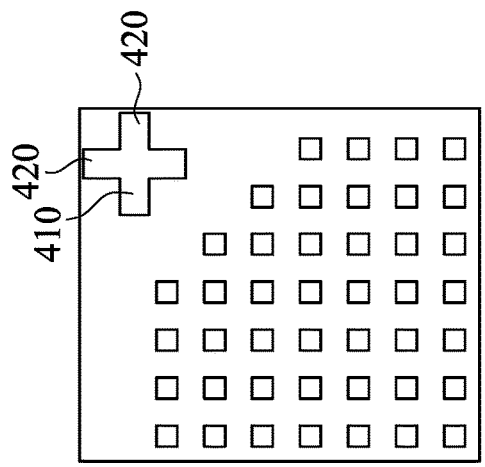

In FIG. 8F, the mini-pad has the shape of a cross, which may also be considered to be two legs 420 joined to each other at or near their centers. They may be joined at any angle, and are illustrated here as being joined at a right angle.

In FIG. 8G, the mini-pad has the shape of a trapezoid. The trapezoid has two parallel sides (bases) and two legs. Any of the four sides of the trapezoid may be placed adjacent to the conductive pads 355.

Referring back to FIG. 6C and FIG. 7, the use of the mini-pad reduces the degree of mismatch between the corner of the surface-mount package and the corresponding corner of the joint area of the PCB. For example, if the spacing between adjacent solder balls in the ball grid array on the bottom of the package is 300 micrometers, then the critical dimension (CD) of the ball grid array is 150 micrometers to avoid bridging. At the corners of the package, the CD is essentially equivalent to the warpage 400. The presence of the mini-pad may be thought of as pushing the package back towards flatness, or reducing the warpage/CD. For example, if the package has a warpage of 286 micrometers, and the mini-pad has a thickness of 200 micrometers, then the resulting degree of mismatch at the corner is only 86 micrometers. This is less than the CD of 150 micrometers, and thus bridging is avoided. In some embodiments, the critical dimension (i.e. half of the spacing between the pads of the ball grid array) is from about 50 micrometers to about 500 micrometers.

Figure 9A:
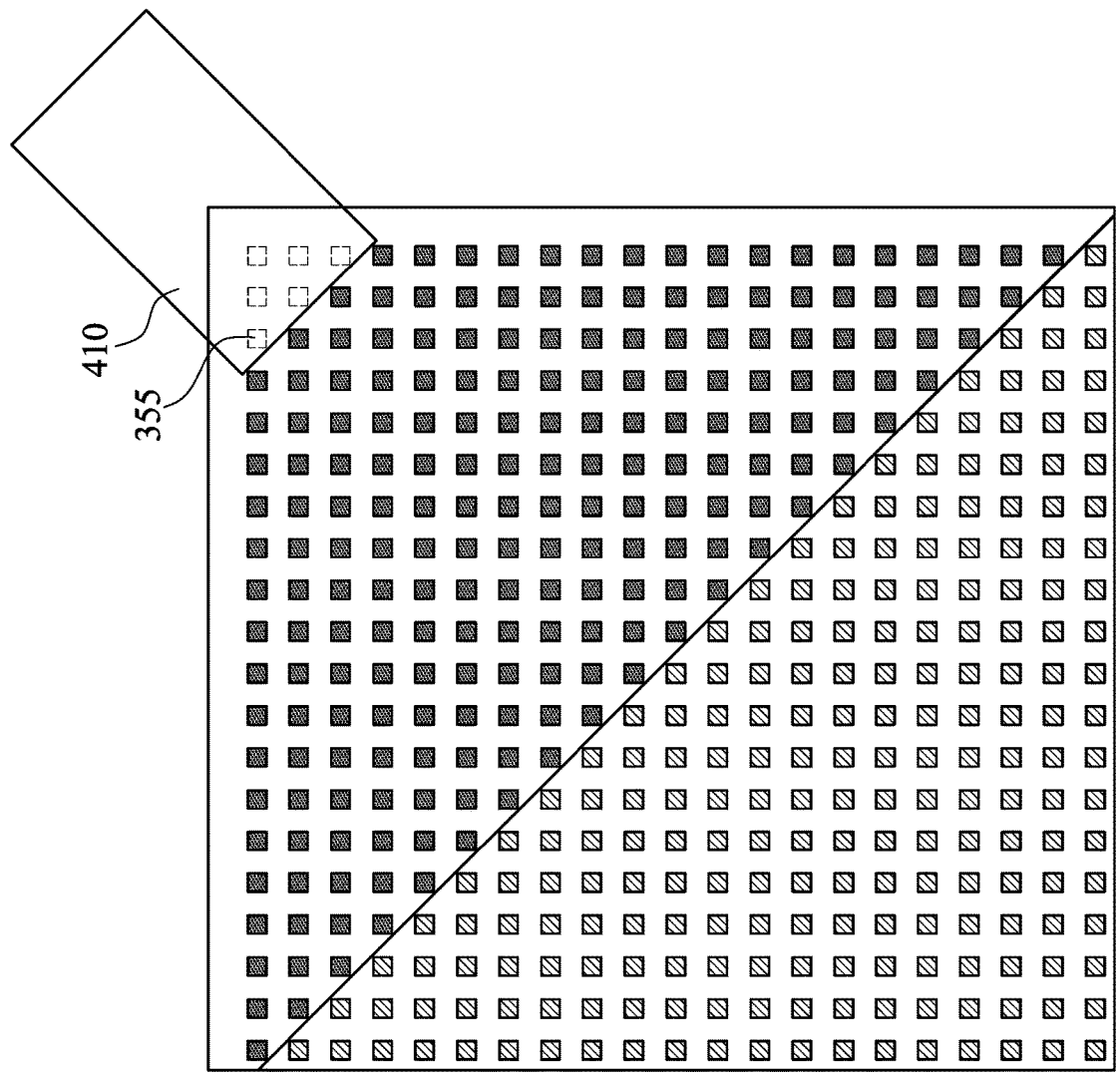
FIG. 9A is a plan view of another embodiment, in which the mini-pads are mounted above conductive pads of the joint area on the PCB.
Figure 9B:
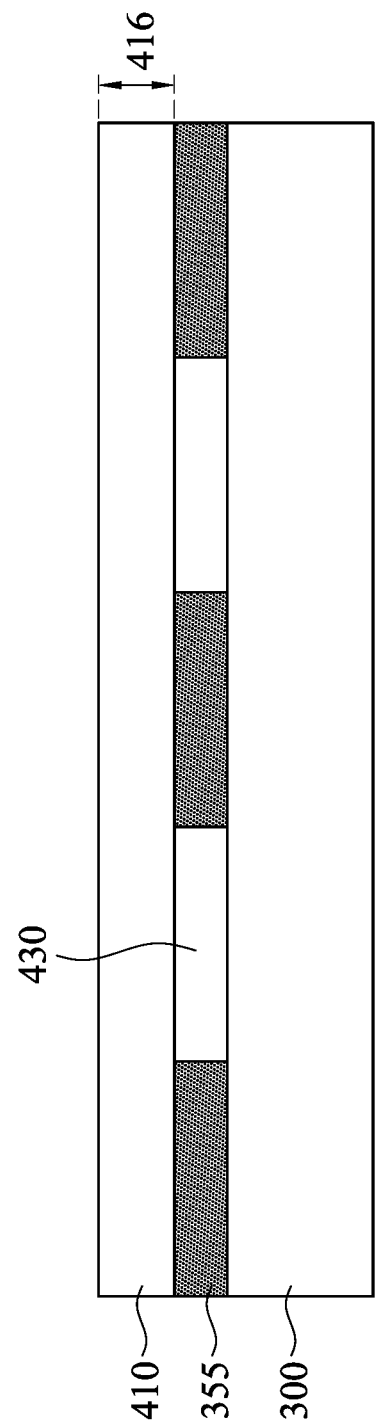
FIG. 9B is a side view of this embodiment.

In some alternative embodiments as illustrated in the magnified views of FIG. 9A and FIG. 9B, the joint area is a full rectangular array. Put another way, there is no triangular portion that lacks conductive pads. It is also contemplated that the mini-pad 410 could be placed in the corner upon the conductive pads 355. In the plan view of FIG. 9A, the conductive pads 355 are shown in dashed line. In the side view of FIG. 9B, the mini-pad 410 is upon the conductive pads 355, which are above the PCB 300. Adhesive 430 is located between the conductive pads.

Figure 9C:
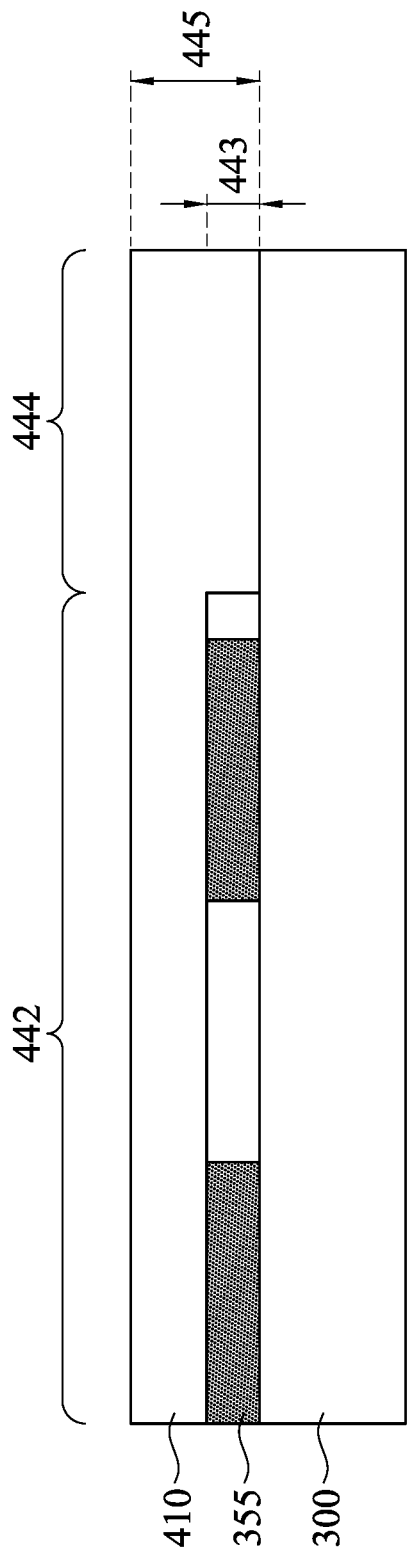
FIG. 9C is a side view of an alternative embodiment, in which only part of the mini-pad is mounted upon the conductive pad, and so the thickness of the mini-pad varies.

As seen in FIG. 9B, the thickness 416 of the mini-pad is constant or regular along the length/width/diameter of the mini-pad. In an alternative embodiment as illustrated in the side view of FIG. 9C, a first part 442 of the mini-pad 410 is located upon the conductive pad 355, and a second part 444 of the mini-pad is not upon the conductive pad, and instead rests upon the surface 302 of the PCB 300. The first part 442 may be referred to as an overhang, and has a thickness 443 that is less than the thickness 445 of the second part of the mini-pad. The ratio of the overhang thickness 443 to the second part thickness 445 may range from about 1:1 to about 1:10.

The methods of the present disclosure are discussed above with respect to the surface-mount package using a ball grid array. However, it is believed that these methods can also be used with other types of packages. For example, the package may be quad-flat package (QFP), in which the electrical contacts are in the form of leads extending from the sides of the package. The package may also be a no-lead package, in which the electrical contacts are present on the bottom of the substrate of the package. No-lead packages may include, for example, DFN, QFN, and MLP packages.

The methods of the present disclosure are also compatible with other surface-mount processes. For example, under-fill may still be incorporated between the package and the PCB to mitigate thermal expansion mismatch and corrosion resistance and to prevent the formation of voids.

Figure 10A:
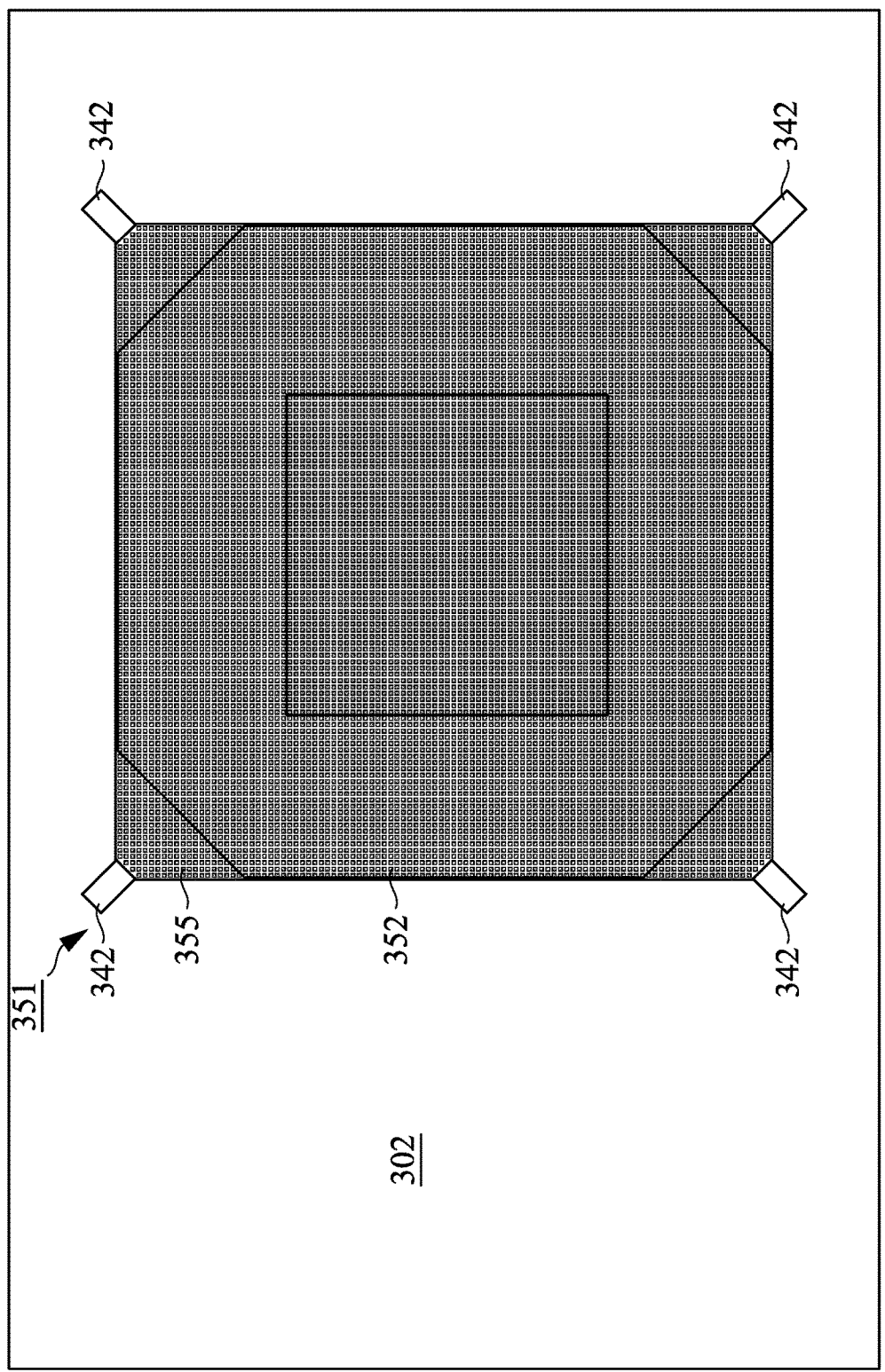
FIG. 10A is a plan view of another embodiment, in which raised pads in the corners of a joint area are formed as an integral part of the printed circuit board (PCB).
Figure 10B:
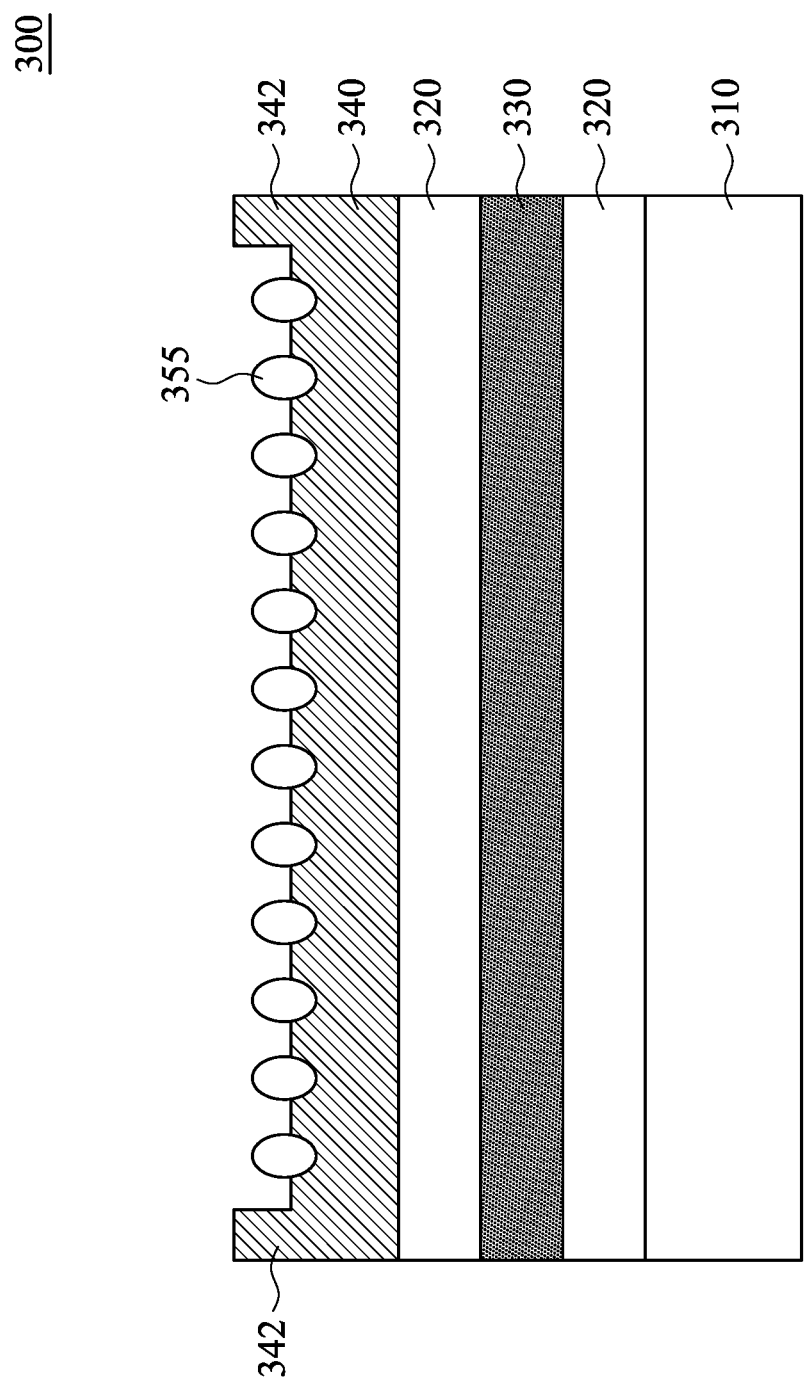
FIG. 10B is a side view of this embodiment.

In another embodiment as illustrated in FIG. 10A and FIG. 10B, the printed circuit board 300 includes a joint area 350 on the surface 302 thereof. One or more corners 351 of the contact grid lack conductive pads 355. Instead, a raised pad 342 is present in the corner. The raised pad has a thickness 343 of about 50 micrometers to about 500 micrometers, similar to that of the mini-pad previously described. The raised pad may have any desired shape, including those previously described for the mini-pad.

As illustrated in FIG. 10B, it is contemplated that the raised pad 342 is formed as an integral part of the solder mask or solder resist layer 340. The solder resist layer may be made from, for example, epoxy or similar ink. The solder resist layer may need to be cured, for example via exposure to UV light. The raised pad is desirably made in a one-step process along with the rest of the solder resist layer, but can be formed in a second separate step. The raised pads 342 are higher than the conductive pads 355. The core 310, electrically conductive layers 320, and electrically insulating layer 330 are also shown for reference.

The methods of the present disclosure increase the board-level reliability (BLR) of the final PCB with the attached semiconductor package. BLR refers to the robustness of the semiconductor package once the device is soldered to the PCB, and verifies the reliability of the solder joints under different conditions such as temperature cycling, bending, mechanical shock, and vibration. Different BLR tests and standards may include JEDEC B102/B103/A104/B111/B113, IPC-9701~9704/9708, and AEC-Q104. This also increases system-level reliability (SLR) for systems using such PCBs.

Some embodiments of the present disclosure thus relate to methods for reducing or preventing solder bridges between a mismatched surface-mount package and a printed circuit board. A mini-pad is applied to a corner of a joint area on the printed circuit board to counter the mismatch. The surface-mount package is then soldered to the joint area of the PCB.

Other embodiments of the present disclosure relate to methods for improving joinder between a surface-mount package and a printed circuit board. The warpage at a corner of the surface-mount package is measured. The warpage at a corresponding corner of a joint area of the PCB is also measured. The degree of mismatch between the corner of the surface-mount package and the corresponding corner of the joint area of the PCB is then determined. Next, a mini-pad is applied to the corresponding corner of the joint area. The mini-pad has a thickness sufficient to reduce the degree of mismatch below a critical dimension of a ball grid array of the surface-mount package. The surface-mount package and the joint area of the PCB are then soldered together.

Additional embodiments relate to a printed circuit board which can be used to practice these methods. The printed circuit board comprises a joint area which can be attached to a surface-mount package. A raised pad is present in each corner of the joint area. Each raised pad has a thickness of about 50 micrometers to about 500 micrometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reducing solder bridges between a surface-mount package and a printed circuit board, comprising:
   determining a degree of mismatch between the corner of the surface-mount package and the corresponding corner of the joint area;
   applying a mini-pad to a corner of a joint area on the printed circuit board to counter any mismatch; and
   soldering the surface-mount package to the joint area of the printed circuit board.

2. The method of claim 1, wherein the joint area lacks conductive pads in a corner where the mini-pad is applied.

3. The method of claim 1, wherein the mini-pad has a length of about 1 millimeter to about 100 millimeters, a width of about 1 millimeter to about 100 millimeters, and a thickness of about 50 micrometers to about 500 micrometers.

4. The method of claim 1, wherein the mini-pad is in the shape of a rectangle, a triangle, an L-shape, a circle, a cross, or a trapezoid.

5. The method of claim 1, wherein the mini-pad is formed from a polymer that is heat resistant at temperatures above 250° C.

6. The method of claim 1, wherein the mini-pad is fixed to the printed circuit board using an adhesive.

7. The method of claim 1, wherein the surface mount package has a size of greater than 85 mm×85 mm.

8. The method of claim 1, wherein the total warpage between the surface-mount package and the printed circuit board is from about 50 micrometers to about 500 micrometers.

9. The method of claim 1, wherein the joint area comprises a plurality of conductive pads in the shape of an octagon having four sides of a first length and four sides of a second length that is different from the first length.

10. The method of claim 1, wherein the mini-pad comprises an overhang which is located upon a conductive pad and a second part that rests upon a surface of the printed circuit board.

11. The method of claim 1, wherein the joint area comprises a central square region with conductive pads having a first diameter, an octagonal region surrounding the central square region with conductive pads having a second diameter, and four trapezoidal regions on alternating sides of the octagonal region with conductive pads having a third diameter;
   wherein the first diameter is greater than the second diameter, and the second diameter is greater than the third diameter.

12. A method for reducing solder bridges between a surface-mount package and a printed circuit board, comprising:
   measuring a warpage at a corner of the surface-mount package;
   measuring a warpage at a corresponding corner of a joint area of the printed circuit board;
   determining a degree of mismatch between the corner of the surface-mount package and the corresponding corner of the joint area;
   applying a mini-pad to the corresponding corner of the joint area, the mini-pad having a thickness sufficient to reduce the degree of mismatch below a critical dimension of a ball grid array of the surface-mount package; and
   soldering the surface-mount package to the joint area of the printed circuit board.

13. The method of claim 12, wherein the critical dimension is about 50 micrometers to about 500 micrometers.

14. The method of claim 12, wherein the mini-pad has a thickness of about 50 micrometers to about 500 micrometers.

15. A method for reducing solder bridges between a surface-mount package and a printed circuit board, comprising:
   determining a degree of mismatch between a corner of a joint area on the printed circuit board and a corresponding corner of the surface-mount package;
   applying a mini-pad to the corner of the joint area on the printed circuit board to counter the mismatch the mini-pad having a thickness sufficient to reduce the degree of mismatch below a critical dimension of a ball grid array of the surface-mount package; and
   soldering the surface-mount package to the joint area of the printed circuit board.

16. The method of claim 15, wherein the mini-pad has a thickness sufficient to reduce the degree of mismatch below a critical dimension of a ball grid array of the surface-mount package.

17. The method of claim 15, wherein the joint area comprises a square array of conductive pads that is missing a trapezoidal pattern of pads in each corner of the square array.

18. The method of claim 15, wherein the joint area comprises a plurality of conductive pads in the shape of an octagon having four sides of a first length and four sides of a second length that is different from the first length.

19. The method of claim 15, wherein the mini-pad comprises an overhang which is located upon a conductive pad and a second part that rests upon a surface of the printed circuit board.

20. The method of claim 15, wherein the joint area comprises a central square region with conductive pads having a first diameter, an octagonal region surrounding the central square region with conductive pads having a second diameter, and four trapezoidal regions on alternating sides of the octagonal region with conductive pads having a third diameter;
   wherein the first diameter is greater than the second diameter, and the second diameter is greater than the third diameter.

* * * * *